(12) United States Patent
Lee et al.

(10) Patent No.: US 11,682,648 B2
(45) Date of Patent: Jun. 20, 2023

(54) SEMICONDUCTOR DEVICE AND METHOD OF FABRICATING THE SAME

(71) Applicant: Samsung Electronics Co., Ltd., Suwon-si (KR)

(72) Inventors: Changbo Lee, Anyang-si (KR); Kwanhoo Son, Yongin-si (KR); Joon Seok Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/070,540

(22) Filed: Oct. 14, 2020

(65) Prior Publication Data

US 2021/0242158 A1  Aug. 5, 2021

(30) Foreign Application Priority Data

Feb. 3, 2020 (KR) .................. 10-2020-0012762

(51) Int. Cl.

| H01L 23/00 | (2006.01) |
|---|---|
| H01L 23/522 | (2006.01) |
| H01L 21/768 | (2006.01) |
| H01L 23/31 | (2006.01) |
| H01L 21/56 | (2006.01) |
| H01L 21/683 | (2006.01) |
| H01L 23/528 | (2006.01) |

(52) U.S. Cl.
CPC ............ *H01L 24/20* (2013.01); *H01L 21/566* (2013.01); *H01L 21/6835* (2013.01); *H01L 21/76871* (2013.01); *H01L 23/315* (2013.01); *H01L 23/5226* (2013.01); *H01L 23/5283* (2013.01); *H01L 24/11* (2013.01); *H01L 24/13* (2013.01); *H01L 24/19* (2013.01); *H01L 2221/68359* (2013.01); *H01L 2224/214* (2013.01)

(58) Field of Classification Search
CPC ................. H01L 24/20; H01L 21/6835; H01L 21/76871; H01L 23/5226; H01L 24/19; H01L 2221/68359; H01L 21/568; H01L 23/528

See application file for complete search history.

(56) References Cited

U.S. PATENT DOCUMENTS 8,017,436 B1  9/2011  Huemoeller et al.
8,283,205 B2  10/2012  Pagaila et al.
(Continued)

*Primary Examiner* — Selim U Ahmed
*Assistant Examiner* — Evan G Clinton
(74) *Attorney, Agent, or Firm* — Muir Patent Law, PLLC

(57) ABSTRACT

Disclosed are semiconductor devices and methods of fabricating the same. The method comprises providing a carrier substrate that includes a conductive layer, placing a semiconductor die on the carrier substrate, forming an insulating layer to cover the semiconductor die on the carrier substrate, forming a via hole to penetrate the insulating layer at a side of the semiconductor die and to expose the conductive layer of the carrier substrate, performing a plating process in which the conductive layer of the carrier substrate is used as a seed to form a via filling the via hole, forming a first redistribution layer on a first surface of the semiconductor die and the insulating layer, removing the carrier substrate, and forming a second redistribution layer on a second surface of the semiconductor die and the insulating layer, the first surface and the second surface being located opposite each other.

16 Claims, 24 Drawing Sheets

(56) References Cited

U.S. PATENT DOCUMENTS

| | | | |
|---|---|---|---|
| 8,981,559 B2 | 3/2015 | Hsu et al. | |
| 8,994,184 B2 | 3/2015 | Pagaila | |
| 9,401,331 B2 | 7/2016 | Lin et al. | |
| 9,633,939 B2 | 4/2017 | Kim et al. | |
| 9,812,340 B2 | 11/2017 | Chang et al. | |
| 9,922,903 B2 | 3/2018 | Hung et al. | |
| 10,096,558 B1 | 10/2018 | Chiang et al. | |
| 2010/0103634 A1* | 4/2010 | Funaya | H01L 25/0657 174/262 |
| 2012/0211892 A1* | 8/2012 | Kim | H01L 24/82 257/774 |
| 2014/0057394 A1* | 2/2014 | Ramasamy | H01L 25/0657 257/E21.507 |
| 2015/0228506 A1* | 8/2015 | Tan | H01L 21/568 438/126 |
| 2016/0163578 A1* | 6/2016 | Yu | H01L 23/5384 257/738 |
| 2019/0148264 A1* | 5/2019 | Chang | H01L 23/4334 257/782 |
| 2019/0252351 A1 | 8/2019 | Lin et al. | |
| 2019/0311988 A1* | 10/2019 | Yu | H01L 24/19 |

\* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2020-0012762 filed on Feb. 3, 2020 in the Korean Intellectual Property Office, the disclosure of which is hereby incorporated by reference in its entirety.

BACKGROUND

The present inventive concepts relate to a semiconductor device, and more particularly, to wafer and panel level semiconductor package.

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board. With the recent development of electronic industry, the semiconductor package is variously developed to reach the goal of compact size, small weight, and/or low manufacturing cost. In addition, many kinds of semiconductor packages show up with the expansion of their application field such as high-capacity mass storage devices.

A size of a semiconductor chip becomes smaller with high integration of the semiconductor chip. It however is difficult to adhere, handle, and test solder balls due to the small size of the semiconductor chip. Additionally, problems may occur in the acquiring of diversified mounting boards in accordance with the size of the semiconductor chip. A fan-out wafer level package (FO-WLP) and fan-out panel level package (FO-PLP) is proposed to address some of these issues.

SUMMARY

Some example embodiments of the present inventive concepts provide a semiconductor device with reduced defects and a method of fabricating the same.

An object of the present inventive concepts is not limited to the mentioned above, and other objects which have not been mentioned above will be clearly understood to those skilled in the art from the following description.

According to some example embodiments of the present inventive concepts, a method of fabricating a semiconductor device may comprise: providing a carrier substrate that includes a conductive layer; placing a semiconductor die on the carrier substrate; forming an insulating layer to cover the semiconductor die on the carrier substrate; forming a via hole to penetrate the insulating layer at a side of the semiconductor die and to expose the conductive layer of the carrier substrate; performing a plating process in which the conductive layer of the carrier substrate is used as a seed to form a via filling the via hole; forming a first redistribution layer on a first surface of the semiconductor die and the insulating layer; removing the carrier substrate; and forming a second redistribution layer on a second surface of the semiconductor die and the insulating layer, the first surface and the second surface being located opposite each other.

According to some example embodiments of the present inventive concepts, a method of fabricating a semiconductor device may comprise: providing a carrier substrate; placing a semiconductor die on the carrier substrate to allow an active surface of the semiconductor die to face the carrier substrate; forming an insulating layer on the carrier substrate, the insulating layer surrounds the semiconductor die; etching the insulating layer to form a via hole that penetrates the insulating layer; forming a seed layer to cover a bottom surface and an inner lateral surface of the via hole; forming a via filling the via hole; forming a first redistribution layer above the semiconductor die and the insulating layer; removing the carrier substrate, wherein removing the carrier substrate includes removing a portion of the seed layer simultaneously when the carrier substrate is removed, the portion of the seed layer being on the bottom surface of the via hole; and forming a second redistribution layer below the semiconductor die and the insulating layer. The bottom surface of the via hole may be at a level lower than a level of the active surface of the semiconductor die and than a level of a bottom surface of the insulating layer.

According to some example embodiments of the present inventive concepts, a semiconductor device may comprise: a lower redistribution layer; a semiconductor die on the lower redistribution layer; an insulating layer on the lower redistribution layer, the insulating layer surrounding the semiconductor die; a via that penetrates the insulating layer and is coupled to a redistribution pattern of the lower redistribution layer; a seed layer between the via and the insulating layer, the seed layer surrounding a lateral surface of the via; and an upper redistribution layer on the insulating layer and the semiconductor die, the upper redistribution layer being coupled to the via. A bottom surface of the via is exposed with respect to the seed layer. The via may extend into the lower redistribution layer.

DETAILED DESCRIPTION OF EMBODIMENTS

The following will now describe a method of fabricating a semiconductor device according to the present inventive concepts in conjunction with the accompanying drawings.

Figure 14:
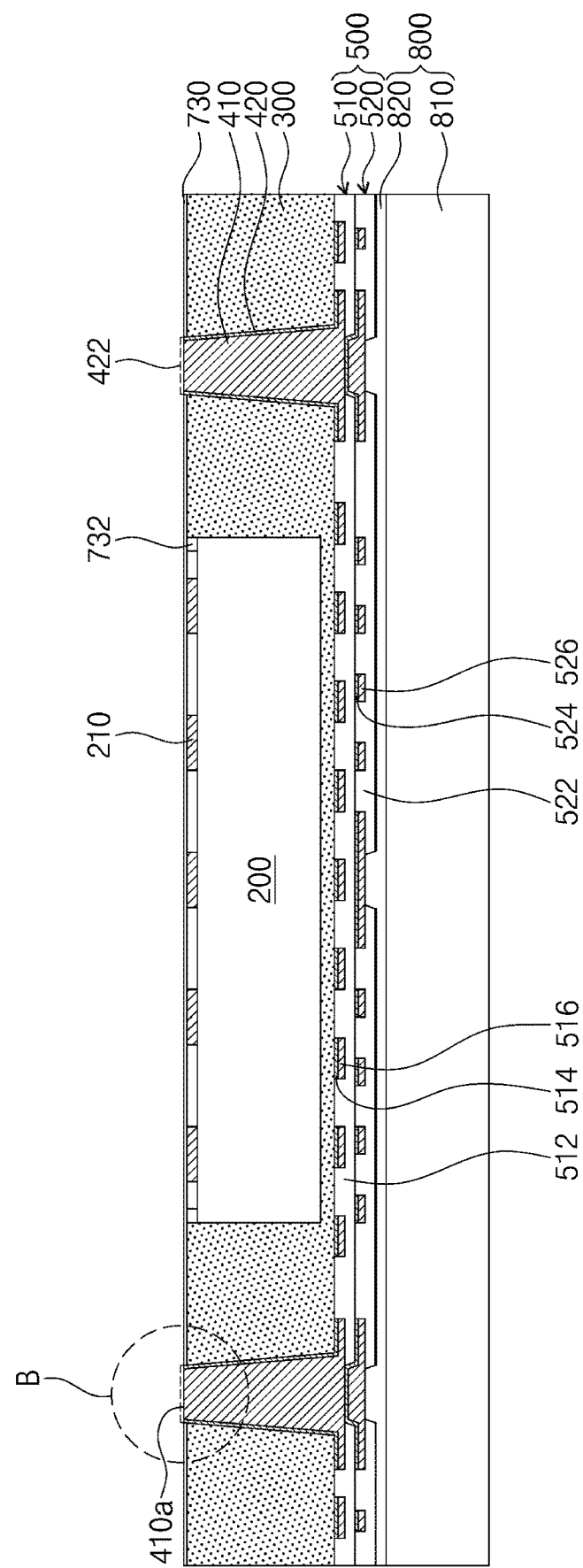
Figure 15:
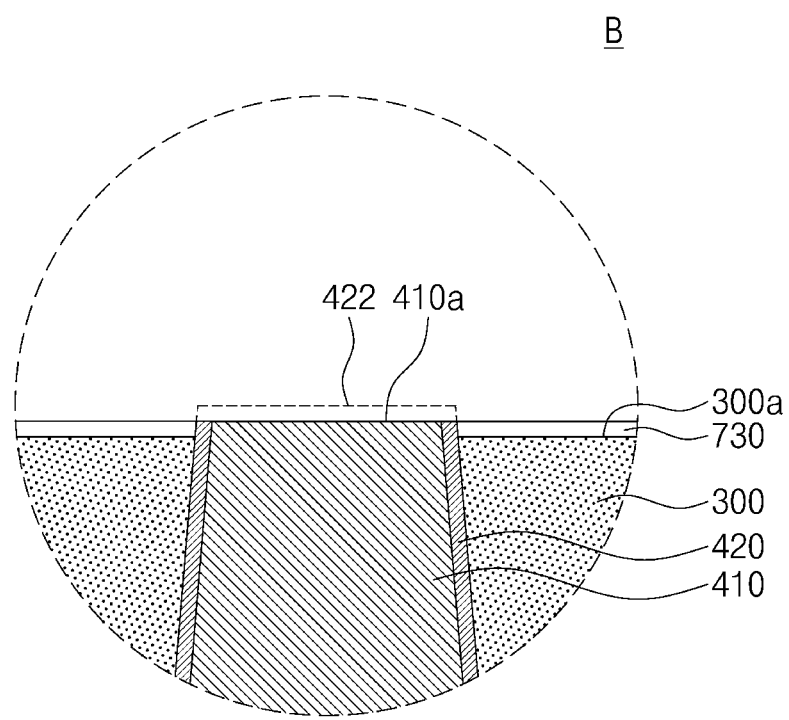
Figure 16:
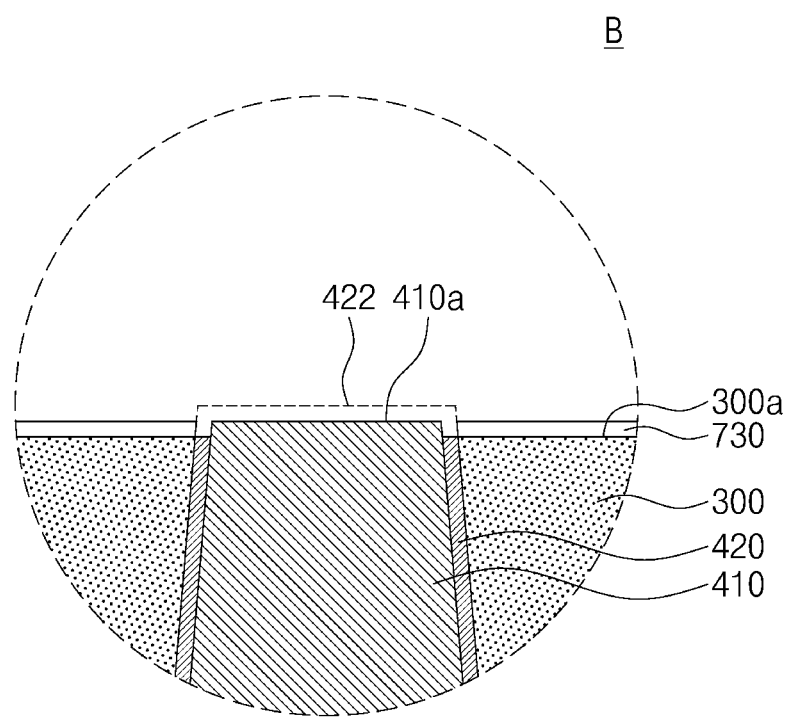

FIGS. 1 to 22 illustrate cross-sectional views showing a method of fabricating a semiconductor device according to some example embodiments of the present inventive concepts. FIGS. 1 to 7, 9 to 14, 17 to 19, 21, and 22 illustrate cross-sectional views showing a method of fabricating a semiconductor device according to some example embodiments of the present inventive concepts. FIG. 8 illustrates an enlarged view showing section A of FIG. 7. FIGS. 15 and 16 illustrate enlarged views showing section B of FIG. 14. FIG. 20 illustrates an enlarged view showing section C of FIG. 19. FIG. 22 illustrates a cross-sectional view showing a semiconductor device according to some example embodiments of the present inventive concepts.

Figure 1:
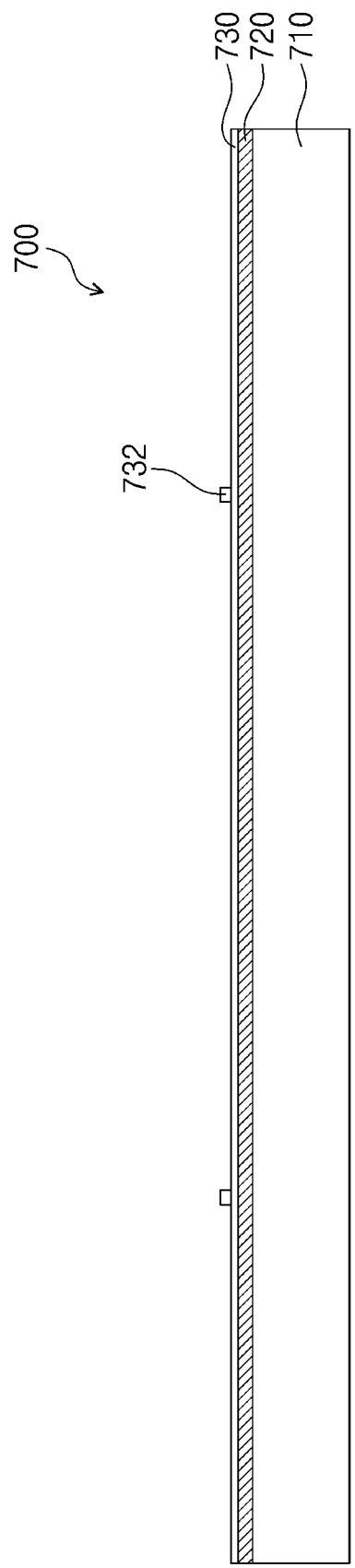
FIGS. 1 to 22 illustrate cross-sectional views showing a method of fabricating a semiconductor device according to some example embodiments of the present inventive concepts.

Referring to FIG. 1, a first carrier substrate 700 may be provided. The first carrier substrate 700 may include a first support substrate 710, a conductive layer 720, and a first release layer 730. The first support substrate 710 may be a carrier or an auxiliary tool disposed on a carrier. The first support substrate 710 may be formed of, for example, glass, plastic, metal, or any other suitable material. The conductive layer 720 may be formed on the first support substrate 710. The conductive layer 720 may be formed by performing a coating or deposition process on the first support substrate 710. The conductive layer 720 may include metal, such as copper (Cu). For example, the conductive layer 720 may be a detachable copper foil. The first release layer 730 may be formed on the conductive layer 720. The first release layer 730 may be a double-sided adhesive tape or an adhesive layer. When the first release layer 730 is a double-sided adhesive tape, a vacuum lamination process may be employed to attach the first release layer 730 to the conductive layer 720. When the first release layer 730 is an adhesive layer, an adhesive material may be coated to form the first release layer 730.

The first carrier substrate 700 may further include a dam 732 disposed on the first release layer 730. The dam 732 may have a shape that upwardly protrudes from the first release layer 730. The dam 732 may define a region on which a semiconductor die 200 is mounted in a subsequent process. The dam 732 may include the same material as that of the first release layer 730. Alternatively, the first carrier substrate 700 may not include the dam 732.

Figure 2:
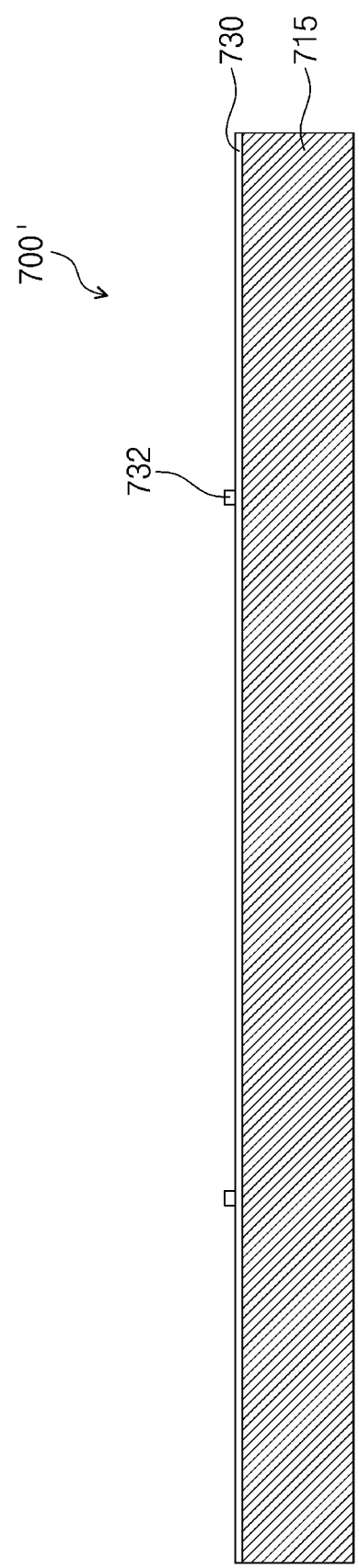

According to some other embodiments as shown in FIG. 2, a first carrier substrate 700' may include a conductive substrate 715 and a first release layer 730. The conductive substrate 715 may be sufficiently thick to serve as both the first support substrate (see the first support substrate 710 of FIG. 1) and the conductive layer (see the conductive layer 720 of FIG. 1). The conductive substrate 715 may include a material selected from at least one of titanium (Ti) and tantalum (Ta). The first release layer 730 may be formed on the conductive substrate 715. The first release layer 730 may be a double-sided adhesive tape or an adhesive layer. The following will focus on the embodiment of FIG. 1.

Figure 3:
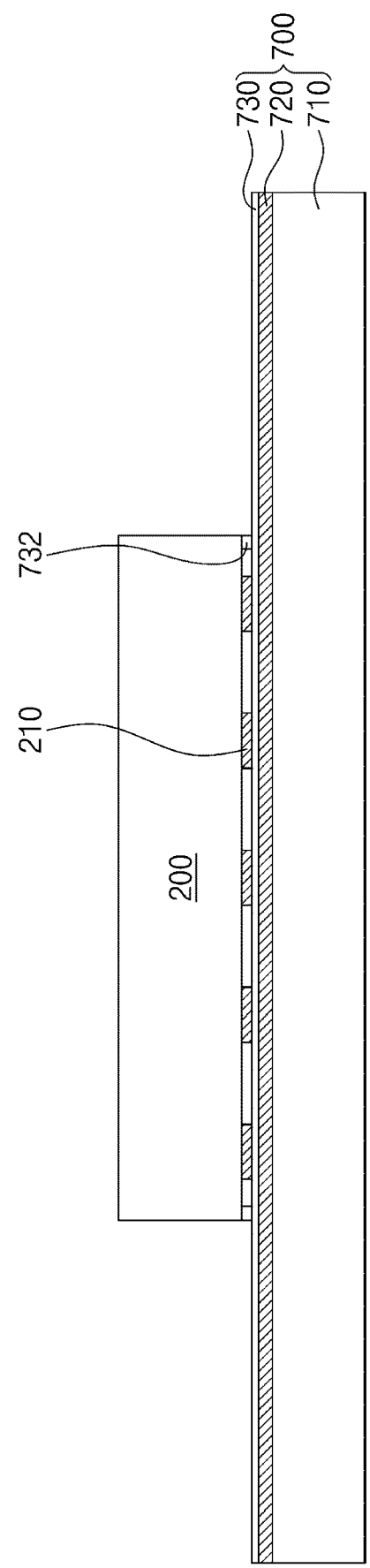

Referring to FIG. 3, a semiconductor die 200 may be disposed on the first carrier substrate 700. An active surface of the semiconductor die 200 may face the first carrier substrate 700. A plurality of die pads 210 may be provided on the active surface of the semiconductor die 200. For example, the semiconductor die 200 may be provided to allow the die pads 210 to contact the first release layer 730 of the first carrier substrate 700. The term "contact," as used herein, refers to a direct connection (i.e., touching) unless the context indicates otherwise. The die pads 210 may separate the active surface of the semiconductor die 200 from a top surface of the first release layer 730. The die pads 210 may be disposed in a region defined by the dam 732. For example, the dam 732 may be positioned along an outer edge of the semiconductor die 200.

Figure 4:
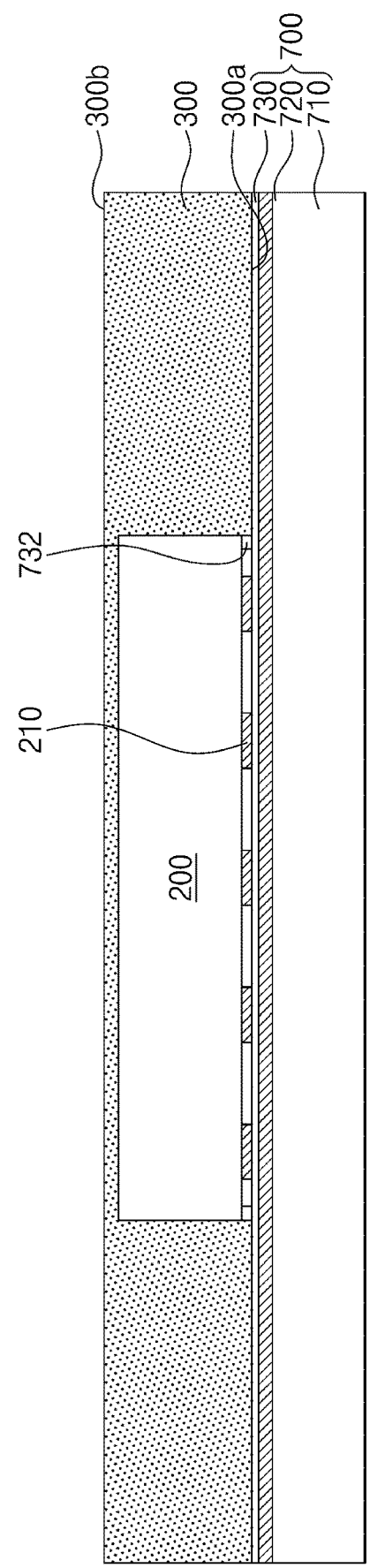

Referring to FIG. 4, an insulating layer 300 may be formed on the first carrier substrate 700. The insulating layer 300 may be formed by coating an insulating material on the first carrier substrate 700. The insulating material may be coated on the first carrier substrate 700 to cover the semiconductor die 200. The insulating layer 300 may cover top and lateral surfaces of the semiconductor die 200. The dam 732 may prevent the insulating material from entering a space between the semiconductor die 200 and the first carrier substrate 700. The insulating layer 300 may have a first surface facing the first carrier substrate 700 and a second surface opposite to the first surface. The insulating material may include an insulating polymer, such as an epoxy molding compound (EMC).

Figure 5:
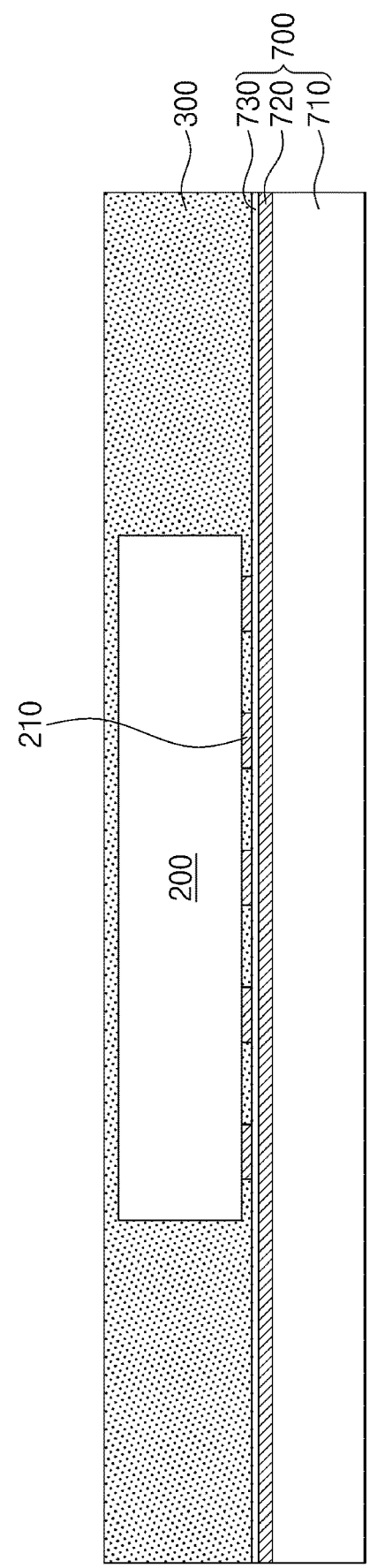

In some other embodiments, the first carrier substrate 700 may not include the dam 732. For example, as shown in FIG. 5, the insulating layer 300 may fill the space between the first carrier substrate 700 and the semiconductor die 200. The insulating material may surround the die pads 210. The following will focus on the embodiment of FIG. 4.

According to some example embodiments of the present inventive concepts, the semiconductor die 200 may be placed on the first carrier substrate 700, and then an insulating material may be coated to form the insulating layer 300. Therefore, it may be possible to reduce process defects, such as damage of the semiconductor die 200 due to distortion of the insulating layer 300 during fabrication processes or delamination of the semiconductor die 200 or the insulating layer 300 from the first carrier substrate 700.

Figure 6:
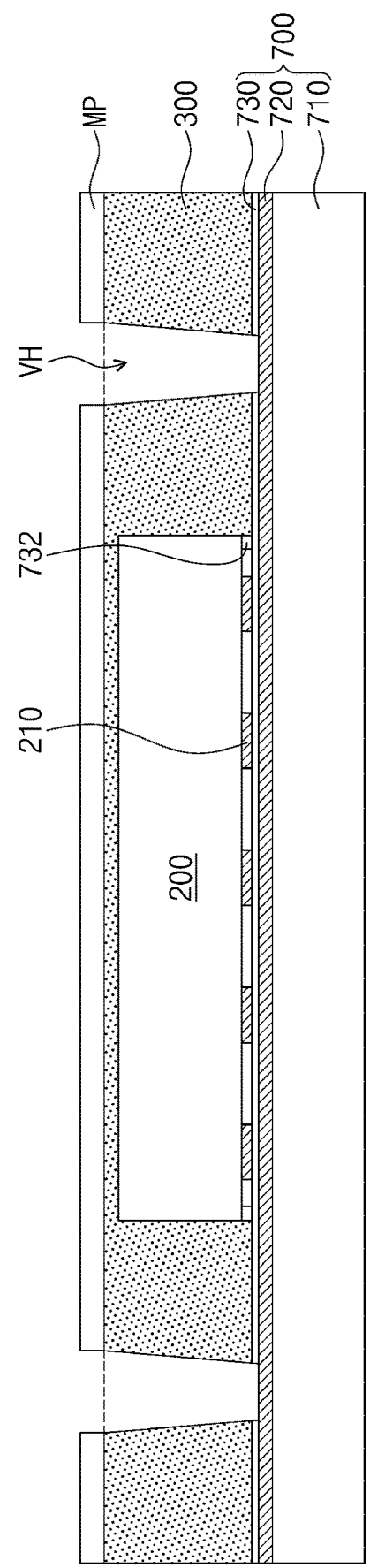

Referring to FIG. 6, a via hole VH may be formed in the insulating layer 300. For example, a mask pattern MP may be formed on the insulating layer 300. When viewed in plan, the mask pattern MP may have a pattern hole horizontally spaced apart from the semiconductor die 200. An etching process may be performed in which the mask pattern MP is used as an etching mask to form the via hole VH in the insulating layer 300. The via hole VH may be formed to have a width that progressively decreases as the via hole VH approaches the first carrier substrate 700. During the etching process, the first release layer 730 of the first carrier substrate 700 may be etched together with the insulating layer 300. For example, the via hole VH may be formed to penetrate the insulating layer 300 and to extend into the first carrier substrate 700. The via hole VH may penetrate the insulating layer 300 and the first release layer 730, thereby exposing the conductive layer 720.

Figure 7:
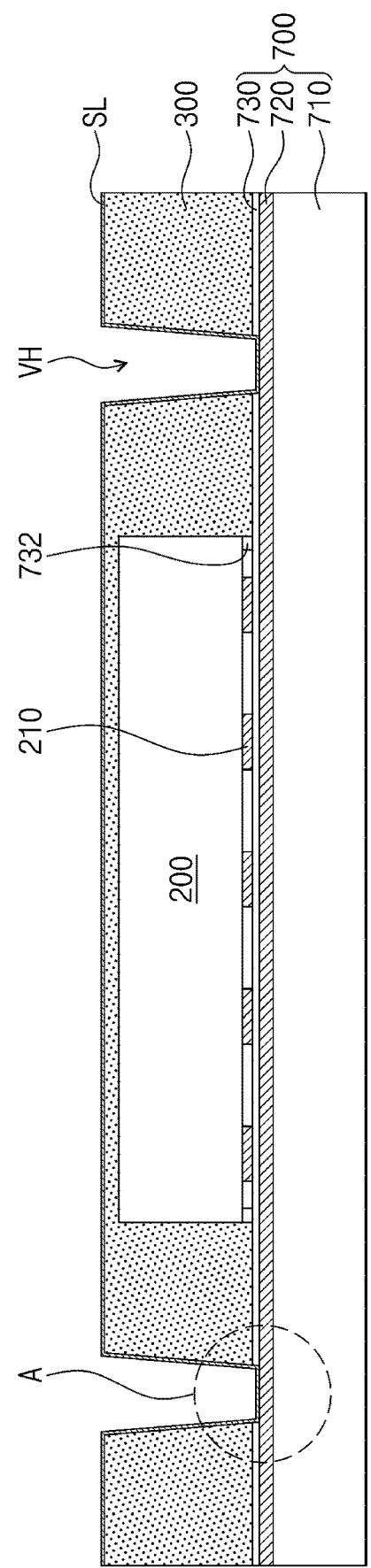
Figure 8:
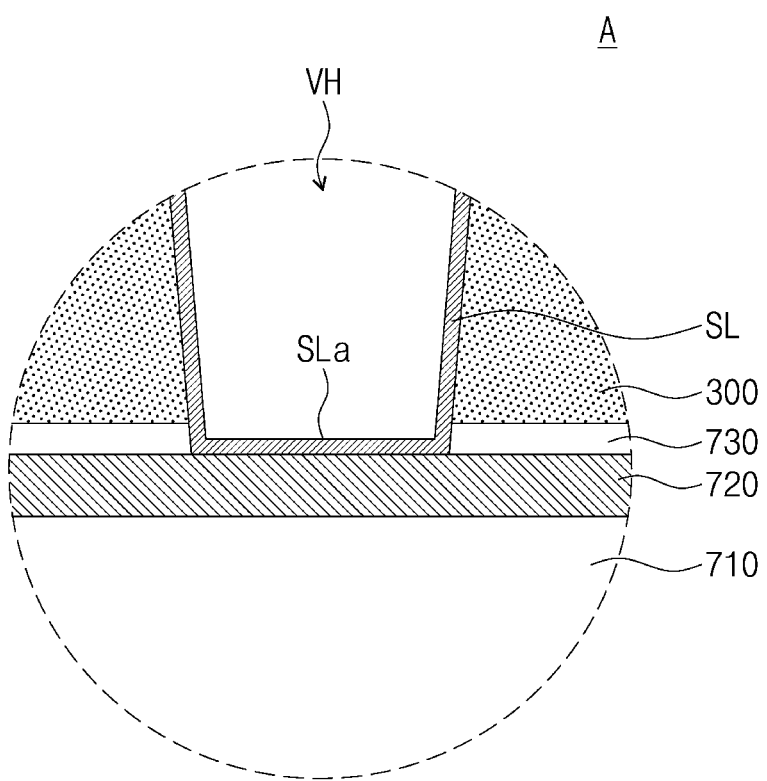

Referring to FIG. 7, the mask pattern MP may be removed from a resultant structure of FIG. 6.

A seed layer SL may be formed on the insulating layer 300. The seed layer SL may conformally cover the insulating layer 300. For example, the seed layer SL may be formed to cover a top surface of the insulating layer 300. In addition, the seed layer SL may be formed along a bottom surface and an inner lateral surface of the via hole VH. The bottom surface of the via hole VH may correspond to an exposed top surface of the conductive layer 720, and the inner lateral surface of the via hole VH may correspond to an inner sidewall of the insulating layer 300 and an inner sidewall of the first release layer 730. For example, as shown in FIG. 8, in the via hole VH, a portion SLa of the seed layer SL may be in contact with the top surface of the conductive layer 720. Moreover, in the via hole VH, the seed layer SL may be in contact with the inner sidewall of the insulating layer 300 and the inner sidewall of the first release layer 730. The seed layer SL may include a metallic material. For example, the seed layer SL may include material selected from at least one of titanium (Ti) and tantalum (Ta). A boundary between the seed layer SL and the conductive layer 720 may be invisible, but the present inventive concepts are not limited thereto.

Figure 9:
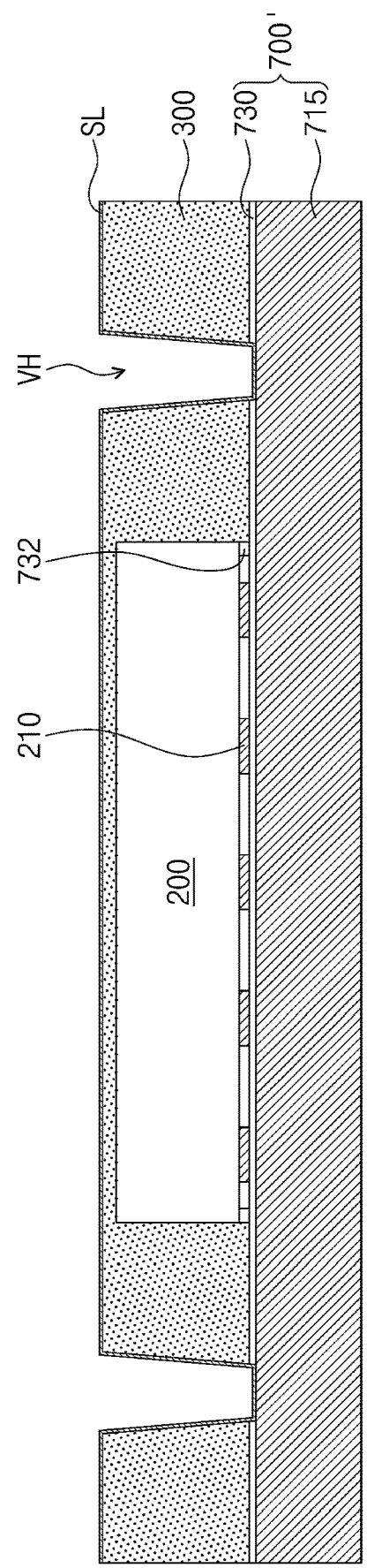

In some other embodiments, the first carrier substrate 700' may include the conductive substrate 715 and the first release layer 730. In this case, as shown in FIG. 9, in the via hole VH, the seed layer SL may be in contact with the conductive substrate 715, and also with the inner sidewall of the insulating layer 300 and the inner sidewall of the first release layer 730. The following will focus on the embodiment of FIG. 7.

Figure 10:
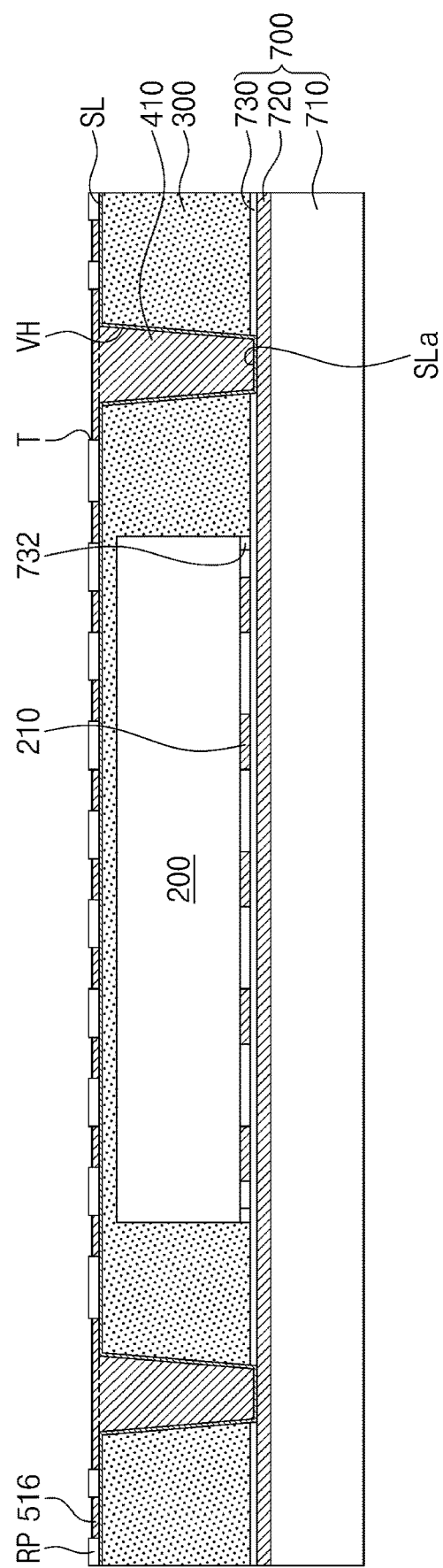

Referring to FIG. 10, a resist pattern RP may be formed on the seed layer SL. A trench T may be formed in the resist pattern RP to expose the seed layer SL. At least a portion of the trench T may overlap the via hole VH. For example, the trench T may be spatially connected to the via hole VH. The trench T may define a region where a first upper redistribution pattern 516 is formed in a subsequent process.

A via 410 and a first upper redistribution pattern 516 may be formed in the via hole VH and the trench T, thereby covering the seed layer SL. A plating process may be employed to form the via 410 and the first upper redistribution pattern 516. For example, a plating process may be performed such that the via hole VH and the trench T are filled with a metallic material, such that the metallic material filling the via hole VH may constitute the via 410 and the metallic material filling the trench T may constitute the first upper redistribution pattern 516. The plating process may include a metal electroless plating process or a metal electroplating process. The plating process may use the seed layer SL as an electrode. An external power for the plating process may be connected to the seed layer SL and the conductive layer 720. The conductive layer 720 may be thicker than the seed layer SL, and may have its resistance less than that of the seed layer SL. Therefore, the portion SLa of the seed layer SL on the bottom surface of the via hole VH may receive an external power from the conductive layer 720.

According to the present inventive concepts, the portion SLa of the seed layer SL in the via hole VH may receive a power from the conductive layer 720 whose resistance is low, and thus a plating process may be easily performed in the via hole VH. As a result, it may be possible to avoid defects, such as a creation of voids within the via 410 in the via hole VH or a filling failure of conductive material in the via hole VH during the plating process.

The first upper redistribution pattern 516 may fill the trench T, but may not extend onto a top surface of the resist pattern RP. Thus, it may be unnecessary to separately perform a planarization process. Based on a shape of the via hole VH, the via 410 may be formed to have a width that progressively decreases as the via 410 approaches the first carrier substrate 700. A metal, such as copper (Cu), may be selected as a source material used in the plating process for forming the via 410 and the first upper redistribution pattern 516.

According to the present inventive concepts, no planarization process may be performed in a process for forming the via 410 and the first upper redistribution pattern 516. Therefore, the semiconductor die 200 may be prevented from damage caused by a planarization process.

Figure 11:
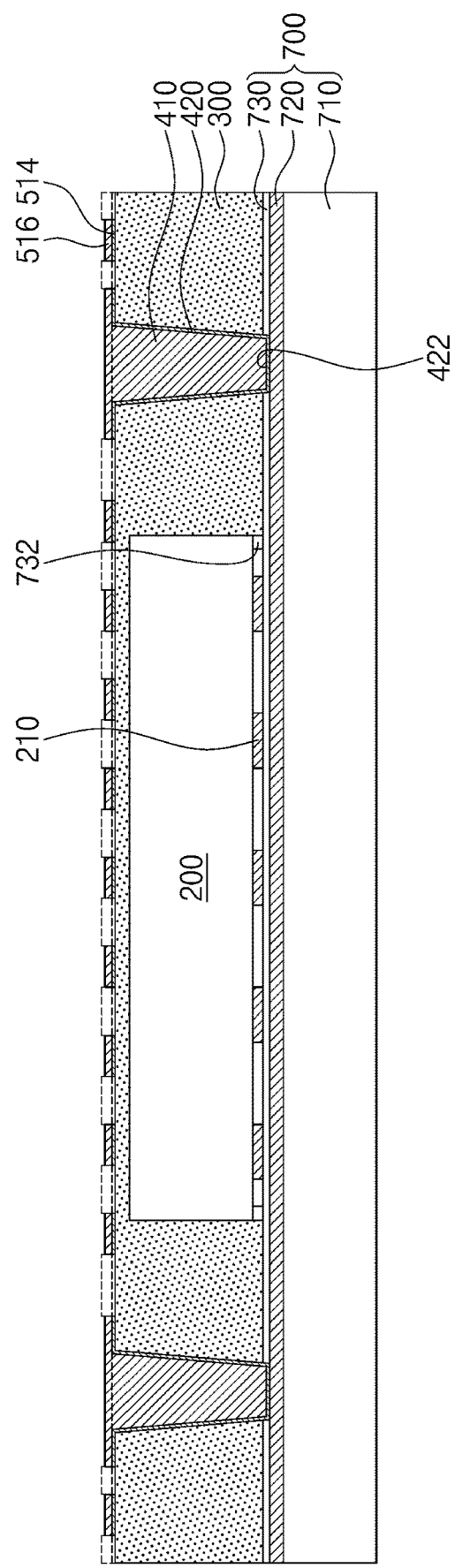

Referring to FIG. 11, the resist pattern RP may be removed to expose a top surface of the seed layer SL and an upper sidewall of the first upper redistribution pattern 516. An exposed portion of the seed layer SL may be removed to expose the top surface of the insulating layer 300. An etching process may be performed to remove the seed layer SL. In the etching process, the first upper redistribution pattern 516 may have an etch selectivity with respect to the seed layer SL. An unexposed portion of the seed layer SL disposed on a bottom surface of the first upper redistribution pattern 516 may thus not be removed in the etching process. A first upper seed pattern 514 may be constituted by the unexposed portion of the seed layer SL disposed on a bottom surface of the first upper redistribution pattern 516. A via seed layer 420 may be constituted by portions of the seed layer SL in the via hole VH and between the via 410 and the insulating layer 300. The via seed layer 420 may be interposed between the via 410 and the insulating layer 300, and may have a bottom part 422 between the via 410 and the conductive layer 720.

Figure 12:
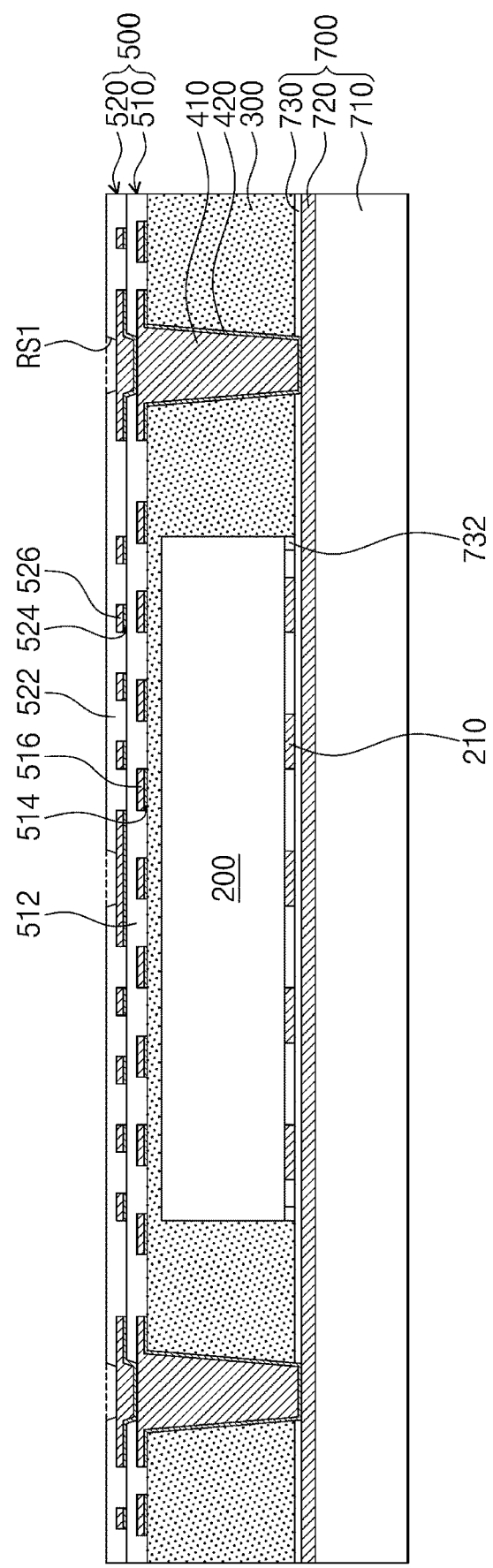

Referring to FIG. 12, a first upper dielectric layer 512 may be formed on the insulating layer 300. The first upper dielectric layer 512 may cover the first upper redistribution pattern 516 and the top surface of the insulating layer 300. A lateral surface of the first upper redistribution pattern 516 may be directly in physical contact with the first upper dielectric layer 512. The first upper dielectric layer 512 may include a photosensitive polymer. In this description, the photosensitive polymer may include, for example, at least one selected from photosensitive polyimide, polybenzoxazole, phenolic polymer, and benzocyclobutene polymers. The first upper dielectric layer 512, the first upper seed pattern 514, and the first upper redistribution pattern 516 may constitute a first upper redistribution layer 510.

A second upper redistribution layer 520 may be formed on the first upper redistribution layer 510. The formation of the second upper redistribution layer 520 may be analogous to that of the first upper redistribution layer 510. For example, a hole may be formed in the first upper dielectric layer 512. The hole may expose a top surface of the first upper redistribution pattern 516. A seed layer may be formed on the first upper dielectric layer 512. The seed layer may be formed along a bottom surface and an inner lateral surface of the hole, while covering a top surface of the first upper dielectric layer 512. A resist pattern may be formed on the seed layer. The resist pattern may have a trench that defines a region where a second upper redistribution pattern 526 is formed. The second upper redistribution pattern 526 may be formed in the hole and the trench of the resist pattern, thereby covering the seed layer. Afterwards, the resist pattern may be removed, and an exposed portion of the seed layer may be removed to form a second upper seed pattern 524. A second upper dielectric layer 522 may be formed on the first upper dielectric layer 512 to cover the second upper redistribution pattern 526. The second upper dielectric layer 522 may have a first recess RS1 that exposes a top surface of the second upper redistribution pattern 526. The second upper dielectric layer 522, the second upper seed pattern 524, and the second upper redistribution pattern 526 may constitute the second upper redistribution layer 520. The first upper redistribution layer 510 and the second upper redistribution layer 520 may constitute an upper redistribution substrate 500, and may have an electrical connection with the via 410.

Figure 13:
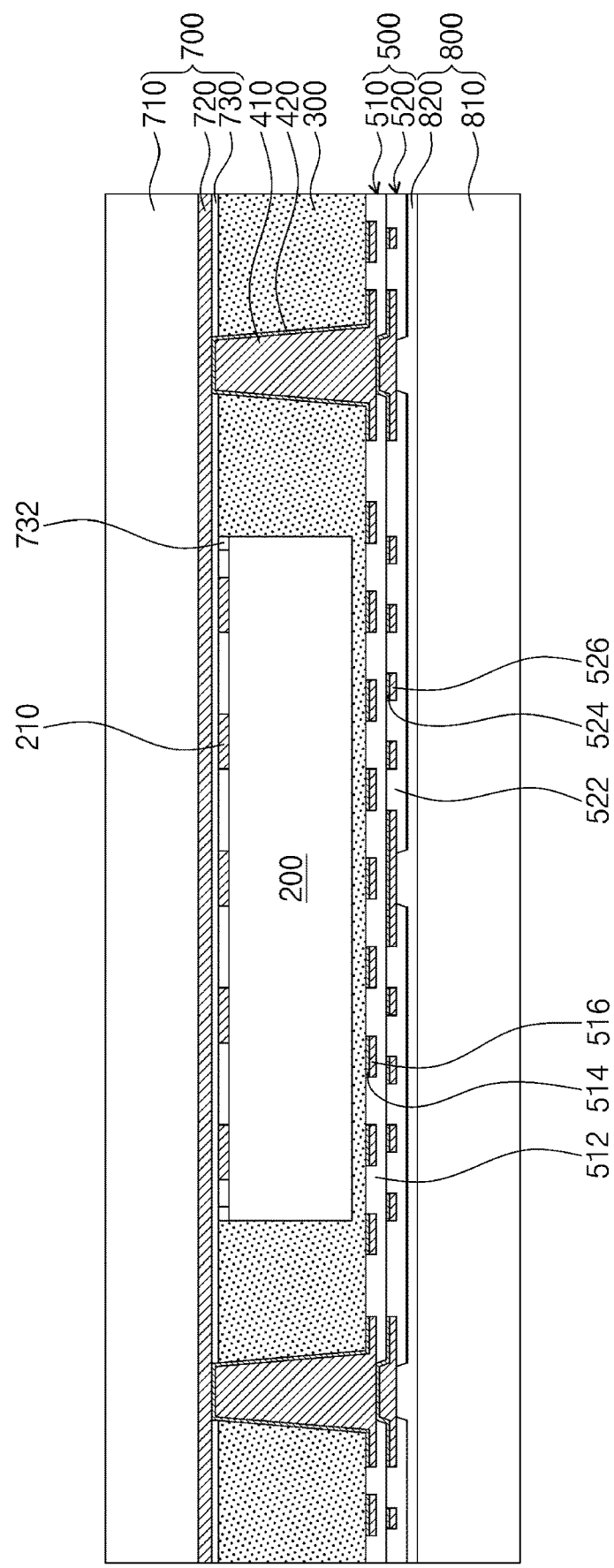

As illustrated in FIG. 13, a resultant structure of FIG. 12 may be oriented to be turned upside down (i.e., "flipped"). For example, in this orientation of the resultant structure of FIG. 12, the first carrier substrate 700 is located above the insulating layer 300 and the active surface of the semiconductor die 200 faces upwards. In addition, a second carrier substrate 800 may be provided on the upper redistribution substrate 500. The second carrier substrate 800 may include a second support substrate 810 and a second release layer 820. The second release layer 820 may be used to attach the second support substrate 810 to the second upper redistribution layer 520. The second support substrate 810 may be formed of, for example, glass, plastic, metal, or any other suitable material. The second release layer 820 may be a double-sided adhesive tape or an adhesive layer.

Spatially relative terms, such as "above," "upper," "beneath," "below," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The first support substrate 710 of the first carrier substrate 700 may be removed. A physical method may be used to remove the first support substrate 710. The first support substrate 710 may be removed to expose the conductive layer 720.

Thereafter, the conductive layer 720 of the first carrier substrate 700 may be removed. When the conductive layer 720 includes a detachable copper foil, the conductive layer 720 may be physically removed. Alternatively, a chemical method may be used to remove the conductive layer 720. The removal of the conductive layer 720 may expose the first release layer 730.

As shown in FIG. 15, the via seed layer 420 may have a bottom part 422 in contact with the conductive layer 720, and the bottom part 422 may be removed simultaneously when the conductive layer 720 is removed. Therefore, the via seed layer 420 may cover a lateral surface of the via 410 and may not cover a bottom surface 410a of the via 410. An end of the via seed layer 420 may be located at the same level as that of the bottom surface 410a of the via 410, and the via 410 and the via seed layer 420 may protrude from a first surface 300a of the insulating layer 300.

According to some other embodiments, as shown in FIG. 16, the removal of the conductive layer 720 may remove a portion of the via seed layer 420, which portion is interposed between the via 410 and the first release layer 730. Therefore, the via seed layer 420 may have an end located at the same level as that of the first surface 300a of the insulating layer 300, and the via 410 may protrude from the first surface 300a of the insulating layer 300.

Figure 17:
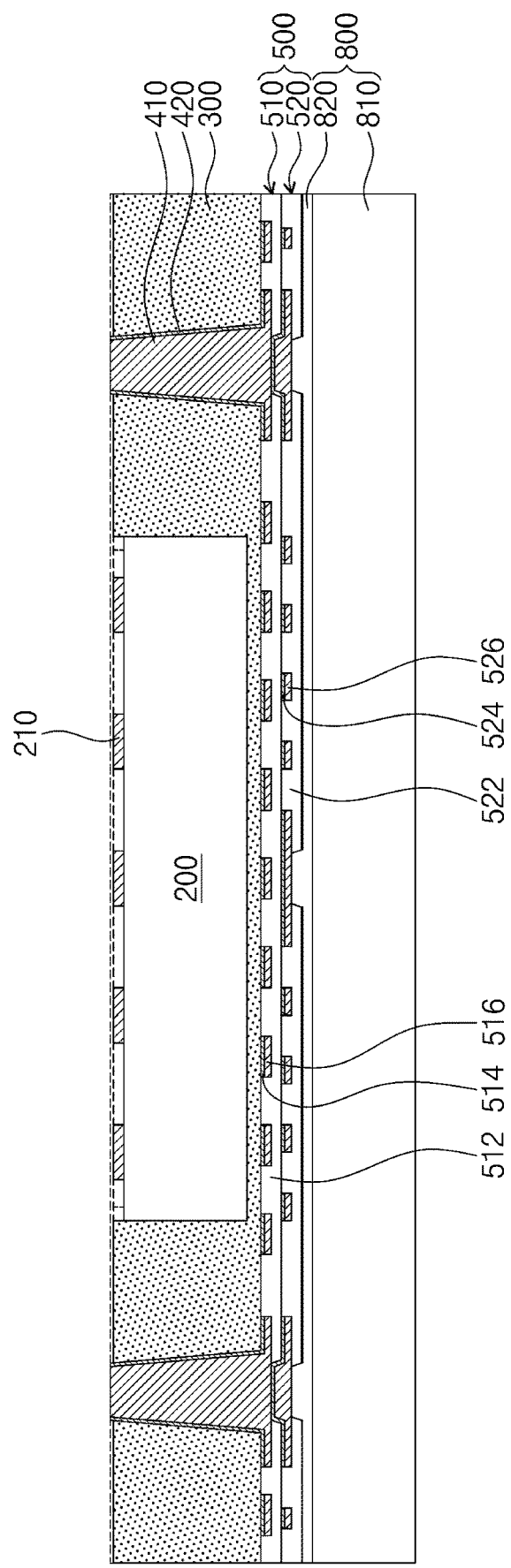

Referring to FIG. 17, the first release layer 730 may be removed. For example, the first release layer 730 may be removed by using a physical method or a chemical treatment. The dam 732 may be removed simultaneously when the first release layer 730 is removed. The removal of the first release layer 730 may expose the first surface 300a of the insulating layer 300 and the active surface of the semiconductor die 200.

Alternatively, when a semiconductor device is fabricated by using the first carrier substrate 700 in which the dam 732 is excluded as shown in the embodiment of FIG. 5, the first release layer 730 may be removed to expose the first surface 300a of the insulating layer 300 and the die pads 210 of the semiconductor die 200.

Figure 18:
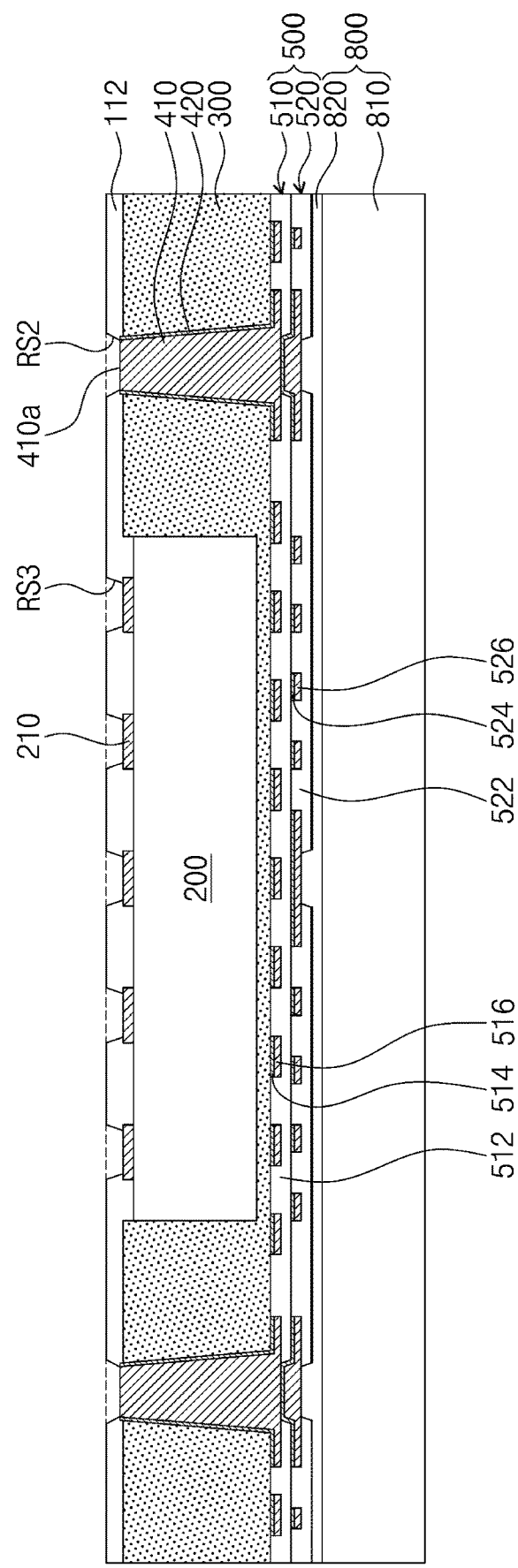

Referring to FIG. 18, a first lower dielectric layer 112 may be formed. The first lower dielectric layer 112 may cover the first surface 300a of the insulating layer 300 and the active surface of the semiconductor die 200. The first lower dielectric layer 112 may include a photosensitive polymer. For example, the photosensitive polymer may include at least one selected from photosensitive polyimide, polybenzoxazole, phenolic polymer, and benzocyclobutene polymer.

A second recess RS2 and a third recess RS3 may be formed on the first lower dielectric layer 112. For example, the first lower dielectric layer 112 may be patterned to form the second recess RS2 and the third recess RS3. The second recess RS2 may expose the bottom surface 410a of the via 410. The third recess RS3 may expose the die pads 210 of the semiconductor die 200. The second recess RS2 may have a width that progressively decreases as approaching the insulating layer 300. The second recess RS2 may have a bottom surface whose width is less than that at the bottom surface 410a of the via 410.

Figure 19:
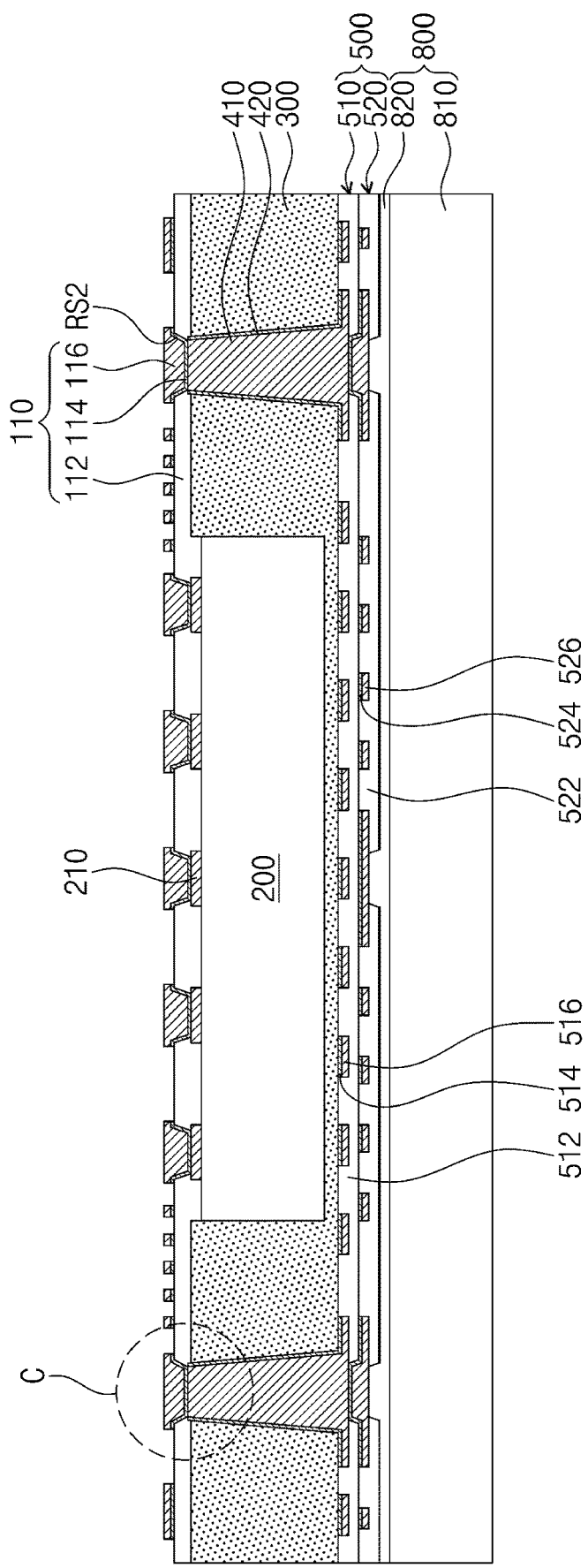
Figure 20:
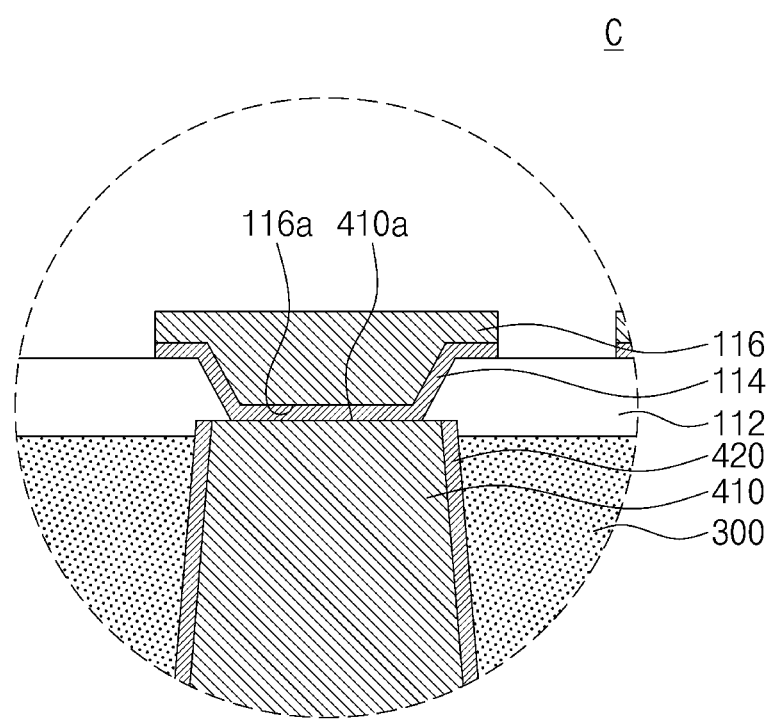

Referring to FIG. 19, a first lower seed pattern 114 and a first lower redistribution pattern 116 may be formed. For example, a seed layer may be formed on the first lower dielectric layer 112. The seed layer may be formed along bottom surfaces and inner lateral surfaces of the second and third recesses RS2 and RS3, while covering the first lower dielectric layer 112. A resist pattern may be formed on the seed layer. The resist pattern may have a trench that defines a region where the first lower redistribution pattern 116 is formed. The first lower redistribution pattern 116 may be formed in the trench of the resist pattern, thereby covering the seed layer. Afterwards, the resist pattern may be removed, and an exposed portion of the seed layer may be removed to form the first lower seed pattern 114. The first lower dielectric layer 112, the first lower seed pattern 114, and the first lower redistribution pattern 116 may constitute a first lower redistribution layer 110.

As shown in FIG. 20, based on a shape of the second recess RS2, the via 410 may have a width greater than that of the first lower seed pattern 114 at an interface between the via 410 and the first lower seed pattern 114. In addition, the width at the bottom surface 410a of the via 410 may be greater than that at a bottom surface of the first lower redistribution pattern 116.

Figure 21:
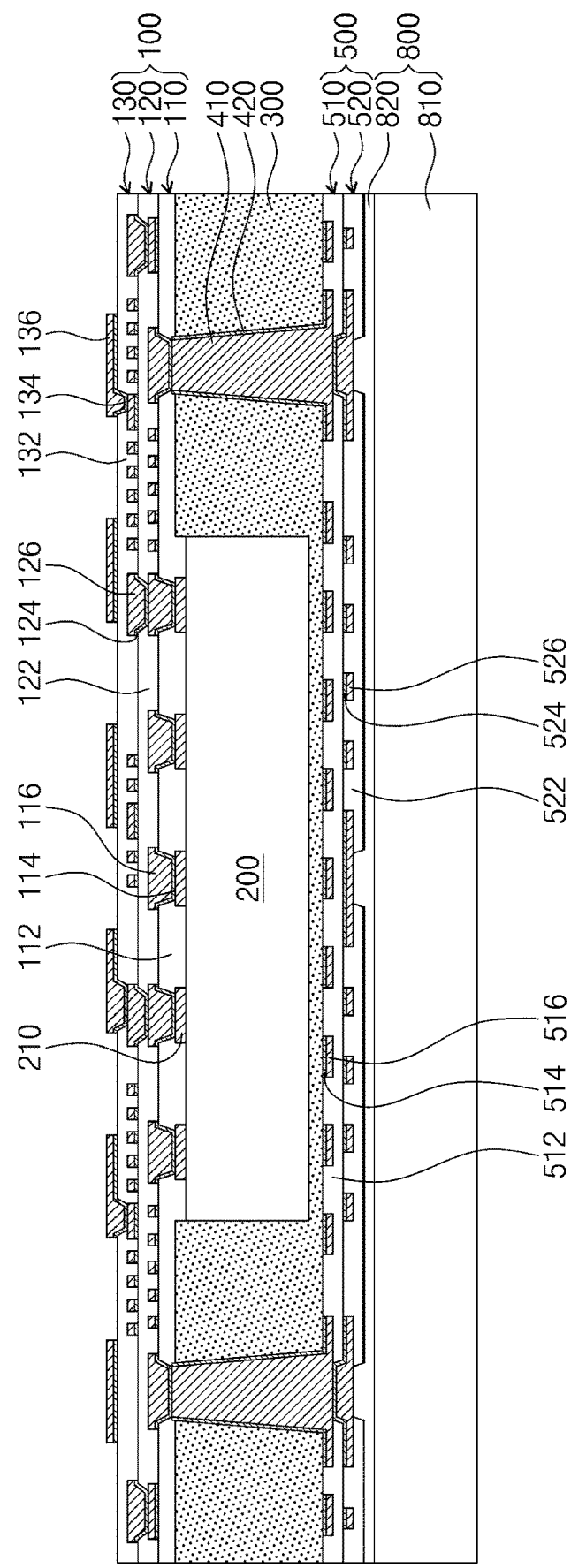
Figure 22:
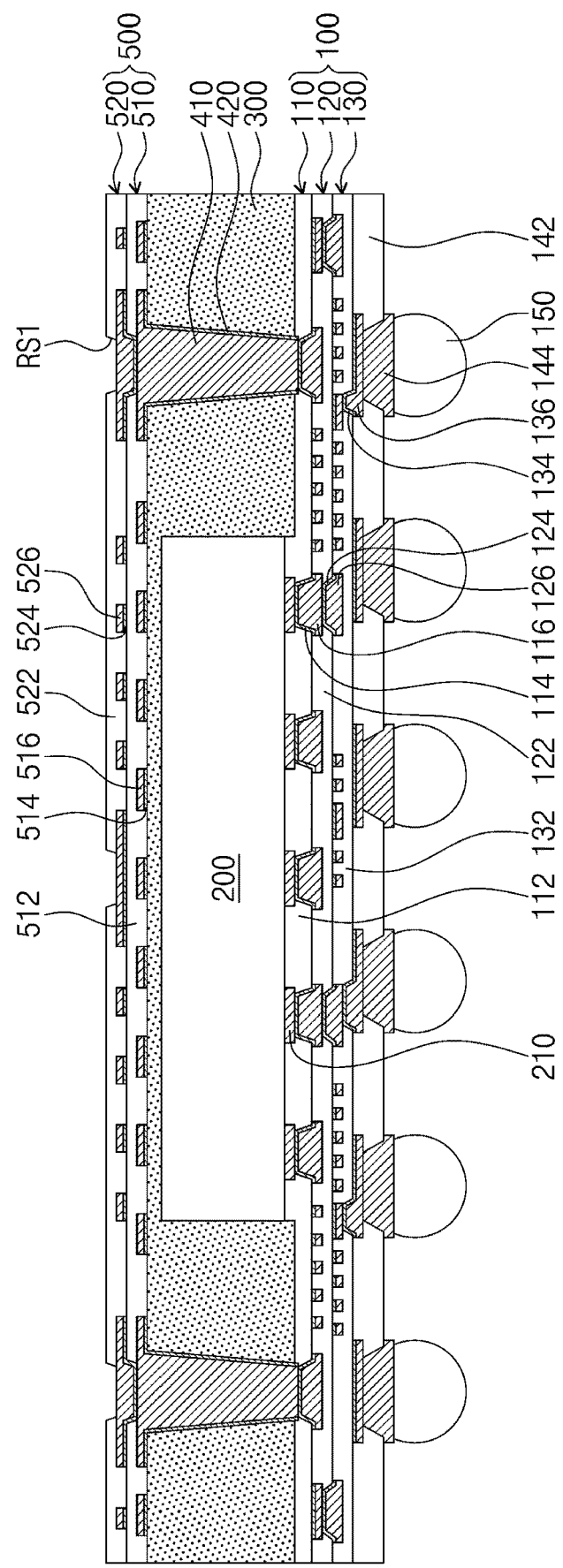

Referring to FIG. 21, a second lower redistribution layer 120 and a third lower redistribution layer 130 may be formed on the first lower redistribution layer 110. The formation of the second and third lower redistribution layers 120 and 130 may be analogous to that of the first lower redistribution layer 110. For example, a second lower dielectric layer 122 may be formed on the first lower dielectric layer 112 to cover the first lower redistribution pattern 116 and the first lower seed pattern 114, and then a second lower seed pattern 124 and a second lower redistribution pattern 126 may be formed to be coupled to the first lower redistribution pattern 116. The second lower dielectric layer 122, the second lower seed pattern 124, and the second lower redistribution pattern 126 may constitute the second lower redistribution layer 120. A third lower dielectric layer 132 may be formed on the second lower dielectric layer 122 to cover the second lower redistribution pattern 126 and the second lower seed pattern 124, and then a third lower seed pattern 134 and a third lower redistribution pattern 136 may be formed to be coupled to the second lower redistribution pattern 126. The third lower dielectric layer 132, the third lower seed pattern 134, and the third lower redistribution pattern 136 may constitute the third lower redistribution layer 130. The first, second, and third lower redistribution layers 110, 120, and 130 may constitute a lower redistribution substrate 100. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present.

As illustrated in FIG. 22, a resultant structure of FIG. 21 may be oriented to be turned upside down. For example, in this orientation of the resultant structure of FIG. 22, the lower redistribution substrate 100 is located below the insulating layer 300 and the active surface of the semiconductor die 200 faces downwards. A protective layer 142 may be formed on the lower redistribution substrate 100. The protective layer 142 may protect the lower redistribution substrate 100. The protective layer 142 may include either a polyamide-based polymer material or an inorganic material, such as silicon oxide (SiOx), silicon nitride (SiNx), and silicon oxynitride (SiON), but the present inventive concepts are not limited thereto.

A terminal pad 144 may be formed on the protective layer 142. The terminal pad 144 may penetrate the protective layer 142 to be coupled to the third lower redistribution pattern 136. The terminal pad 144 may include a conductive material, such as metal.

An external terminal 150 may be disposed on the protective layer 142. For example, the external terminal 150 may be placed on the terminal pad 144. The external terminal 150 may be provided to allow the semiconductor die 200 mounted on the lower redistribution substrate 100 to rest on a different substrate. The external terminal 150 may include a solder ball or a solder bump.

Thereafter, the second carrier substrate 800 may be removed. For example, the second release layer 820 may be removed to detach the second support substrate 810 from the upper redistribution substrate 500. The second release layer 820 may be removed by a physical method or a chemical treatment.

The processes mentioned above may fabricate a semiconductor device according to some example embodiments of the present inventive concepts.

Figure 23:
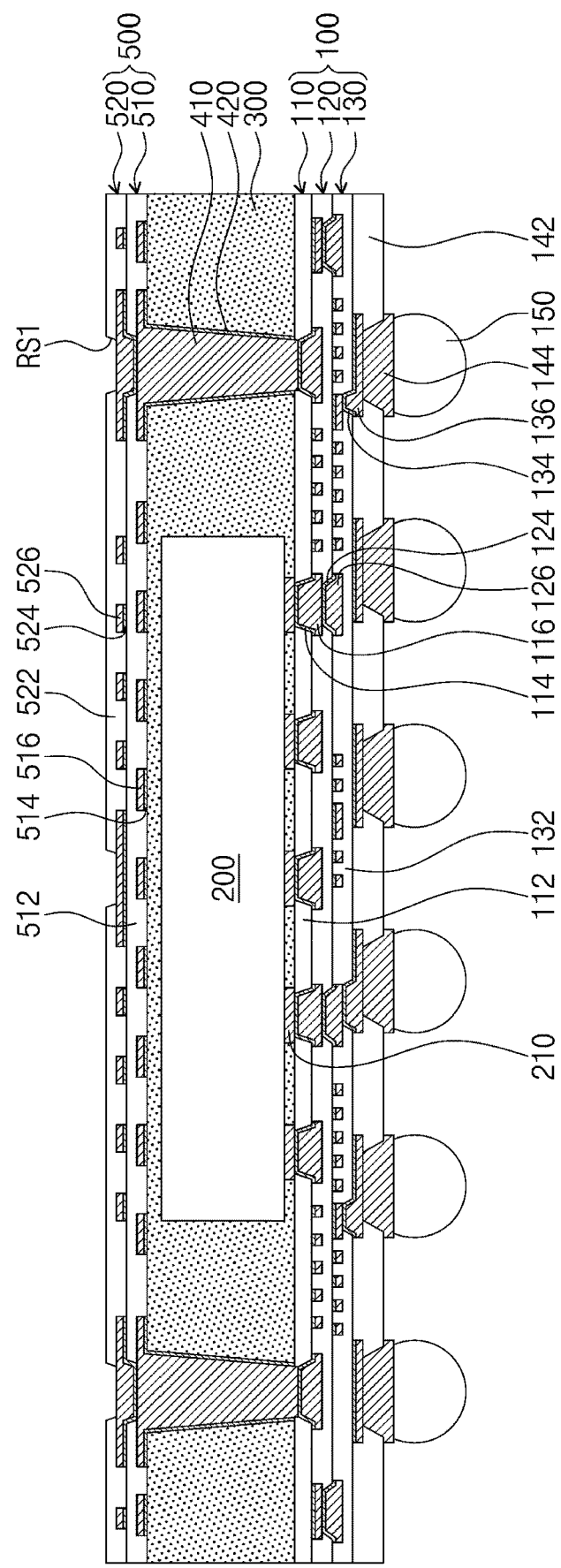
FIG. 23 illustrates a cross-sectional view showing a semiconductor device according to some example embodiments of the present inventive concepts.

FIGS. 22 and 23 illustrate cross-sectional views showing a semiconductor device according to some example embodiments of the present inventive concepts.

Referring to FIG. 22, a semiconductor device may include a lower redistribution substrate 100, a semiconductor die 200, an insulating layer 300, a via 410, and an upper redistribution substrate 500.

The lower redistribution substrate 100 may include a first lower redistribution layer 110, a second lower redistribution layer 120, and a third lower redistribution layer 130 that are sequentially disposed from top to bottom. The first, second, and third lower redistribution layers 110, 120, and 130 may respectively include first, second, and third lower dielectric layers 112, 122, and 132, and may also respectively include first, second, and third lower redistribution patterns 116, 126, and 136 that are disposed in the first, second, and third lower dielectric layers 112, 122, and 132, respectively. The first, second, and third lower redistribution patterns 116, 126, and 136 may be provided in the first, second, and third lower dielectric layers 112, 122, and 132 with first, second, and third lower seed patterns 114, 124, and 134 therebetween. The lower redistribution substrate 100 may use the first, second, and third lower redistribution layers 110, 120, and 130 to redistribute signals sent to and from the semiconductor die 200.

A protective layer 142 may be disposed below the lower redistribution substrate 100. The protective layer 142 may cover the third lower redistribution layer 130 of the lower redistribution substrate 100. A terminal pad 144 may be disposed on the protective layer 142. The terminal pad 144 may penetrate the protective layer 142 to be coupled to the third lower redistribution pattern 136 of the third lower redistribution layer 130.

An external terminal 150 may be disposed on the protective layer 142. For example, the external terminal 150 may be placed on the terminal pad 144. The external terminal 150 may include a solder ball or a solder bump.

The semiconductor die 200 may be mounted on the lower redistribution substrate 100. The semiconductor die 200 may be disposed to allow its active surface to face the first lower redistribution layer 110 of the lower redistribution substrate 100.

The semiconductor die 200 may be coupled through die pads 210 to the first lower seed pattern 114 and the first lower redistribution pattern 116 of the first lower redistribution layer 110.

The first lower dielectric layer 112 of the first lower redistribution layer 110 may have a portion that upwardly protrudes below the semiconductor die 200 and contacts the active surface of the semiconductor die 200. The first lower dielectric layer 112 may surround the die pads 210.

The insulating layer 300 may be disposed on the lower redistribution substrate 100. The insulating layer 300 may cover a top surface of the lower redistribution substrate 100 and may surround the semiconductor die 200. The insulating layer 300 may cover lateral and top surfaces of the semiconductor die 200.

According to some other embodiments, as shown in FIG. 23, the semiconductor die 200 may be spaced apart from the first lower dielectric layer 112 of the lower redistribution substrate 100. The semiconductor die 200 may be coupled to the first lower redistribution pattern 116 through the die pads 210 that are provided between the first lower dielectric layer 112 and the semiconductor die 200. The insulating layer 300 may extend between the semiconductor die 200 and the first lower dielectric layer 112 to fill a space between the semiconductor die 200 and the first lower dielectric layer 112. Between the semiconductor die 200 and the first lower dielectric layer 112, the insulating layer 300 may surround the die pads 210. The following will focus on the embodiment of FIG. 22.

A via 410 may be disposed in the insulating layer 300. The via 410 may vertically penetrate the insulating layer 300 at a side of the semiconductor die 200. The via 410 may have a width that progressively decreases as it approaches the lower redistribution substrate 100. The via 410 may penetrate the insulating layer 300 and may protrude onto a bottom surface of the insulating layer 300. The via 410 may extend into the first lower dielectric layer 112 of the lower redistribution substrate 100, thereby being coupled to the first lower redistribution pattern 116. The first lower seed pattern 114 may be interposed between the via 410 and the first lower redistribution pattern 116. For example, the via 410 may have a bottom surface in contact with the first lower seed pattern 114. As shown in FIG. 20, at an interface between the via 410 and the first lower seed pattern 114, the via 410 may have a width greater than that of the first lower seed pattern 114. In addition, a width at the bottom surface of the via 410 may be greater than that at a top surface of the first lower redistribution pattern 116.

A via seed layer 420 may be interposed between the insulating layer 300 and the via 410. For example, the via seed layer 420 may surround a lateral surface of the via 410. The bottom surface of the via 410 may not be covered by the via seed layer 420, and may be exposed with respect to the via seed layer 420. For this reason, the via 410 may be in direct contact with the first lower seed pattern 114.

The upper redistribution substrate 500 may be disposed on the insulating layer 300. The upper redistribution substrate 500 may include a first upper redistribution layer 510 and a second upper redistribution layer 520 that are disposed on the insulating layer 300. The first and second upper redistribution layers 510 and 520 may respectively include first and second upper dielectric layers 512 and 522, and may also respectively include first and second upper redistribution patterns 516 and 526 that are disposed in the first and second upper dielectric layers 512 and 522, respectively. The first and second upper redistribution patterns 516 and 526 may be provided in the first and second upper dielectric layers 512 and 522 with the first and second upper seed patterns 514 and 524 therebetween. The first upper redistribution pattern 516 of the first upper redistribution layer 510 may be coupled to the via 410. The second upper dielectric layer 522 of the second upper redistribution layer 520 may cover the second upper redistribution pattern 526. The second upper dielectric layer 522 may have a first recess RS1 that exposes a portion of the second upper redistribution pattern 526.

A semiconductor device may be provided and configured as discussed above.

Alternatively, when a semiconductor device is fabricated by using the first carrier substrate 700 in which the dam 732 is excluded as shown in the embodiment of FIG. 5, the active surface of the semiconductor die 200 may not be in contact with the lower redistribution substrate 100. As shown in FIG. 23, the insulating layer 300 may fill a space between the lower redistribution substrate 100 and the active surface of the semiconductor die 200, and the semiconductor die 200 may be coupled through the die pads 210 to the lower redistribution substrate 100. For example, on the lower redistribution substrate 100, the insulating layer 300 may cover the semiconductor die 200 and may extend between the semiconductor die 200 and the lower redistribution substrate 100.

Figure 24:
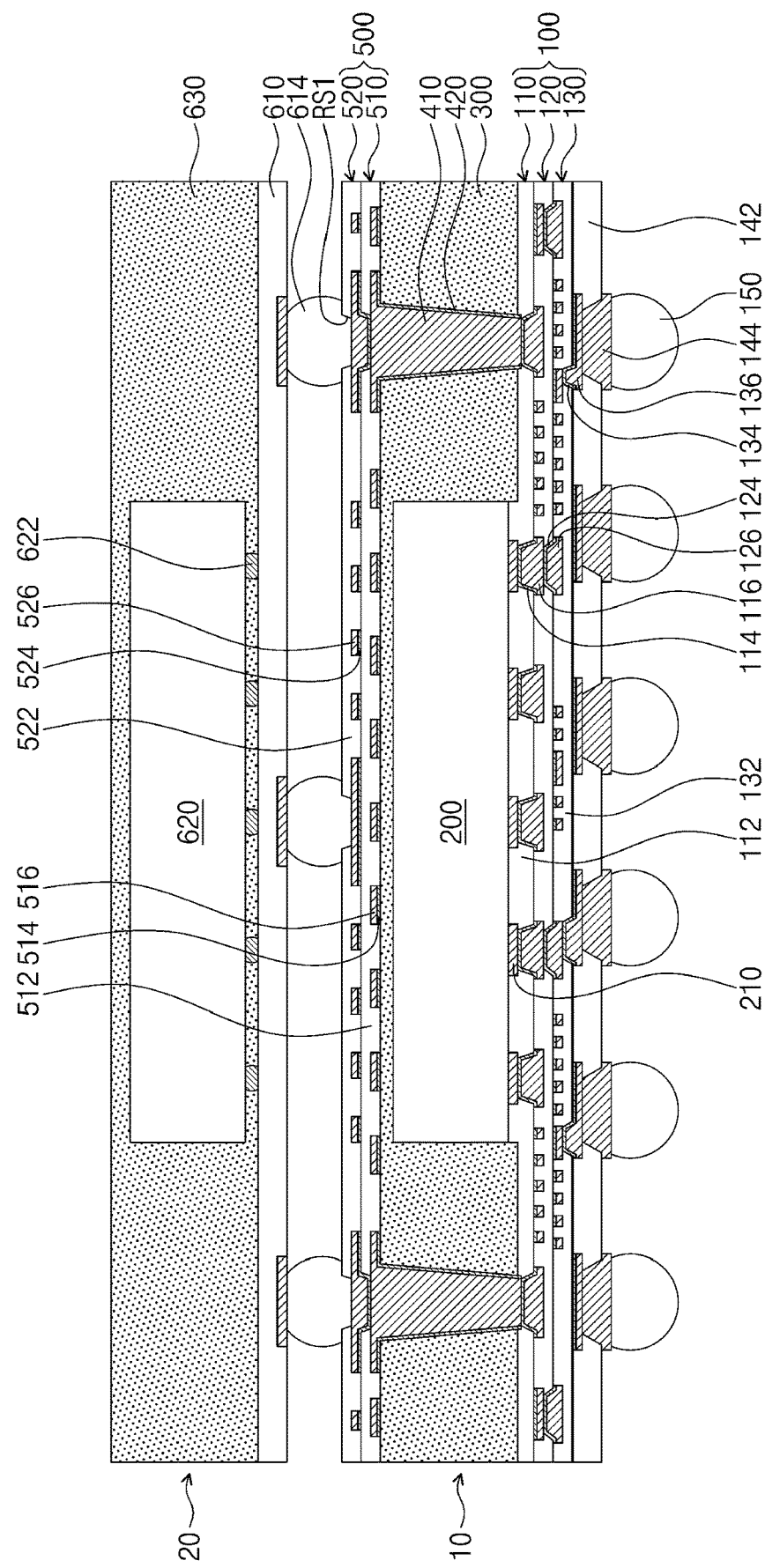
FIG. 24 illustrates a cross-sectional view showing a semiconductor device according to some example embodiments of the present inventive concepts.

FIG. 24 illustrates a cross-sectional view showing a semiconductor device according to some example embodiments of the present inventive concepts.

Referring to FIG. 24, a semiconductor device may include a lower package 10 and an upper package 20. The lower package 10 may be constituted by the lower redistribution substrate 100, the semiconductor die 200, the insulating layer 300, the via 410, and the upper redistribution substrate 500 that are discussed above with reference to FIG. 22.

The upper package 20 may be provided on the lower package 10. The upper package 20 may include an upper package substrate 610, an upper semiconductor die 620 mounted on the upper package substrate 610, and an upper molding layer 630 that covers the upper semiconductor die 620 on the upper package substrate 610. The upper package substrate 610 may include a printed circuit board (PCB) or a redistribution substrate. The upper semiconductor die 620 may be flip-chip mounted on the upper package substrate 610. For example, the upper semiconductor die 620 may be connected through upper die bumps 622 to the upper package substrate 610. For another example, the upper semiconductor die 620 may be wire-bonding mounted on the upper package substrate 610. The upper molding layer 630 may include an epoxy molding compound (EMC).

The upper package 20 may include a connection terminal 614 provided below the upper package substrate 610. The connection terminal 614 may be coupled to a substrate pad of the upper package substrate 610, and may be coupled to the second upper redistribution pattern 526 of the upper redistribution substrate 500 included in the lower package 10, which second upper redistribution pattern 526 is exposed to the first recess RS1. For example, the upper package 20 may be coupled through the connection terminal 614 to the upper redistribution substrate 500, and the upper redistribution substrate 500 may redistribute the upper package 20 to have an electrical connection with the via 410.

A method of fabricating a semiconductor device according to some example embodiments of the present inventive concepts may include placing a semiconductor die on a carrier substrate, and then coating an insulating material to form an insulating layer. Accordingly, it may be possible to reduce process defects, such as damage of the semiconductor die due to distortion of the insulating layer during fabrication processes or delamination of the semiconductor die or the insulating layer from the carrier substrate.

According to the present inventive concepts, a seed layer may have a portion in a via hole, and the portion of the seed layer may receive a power from a conductive layer whose resistance is low, with the result that a plating process may be easily performed in the via hole. As a result, it may be possible to avoid defects, such as a creation of voids within a via in the via hole or a filling failure of conductive material in the via hole during the plating process.

According to the present inventive concepts, no planarization process may be performed in a process for forming a via and an upper redistribution pattern. Therefore, a semiconductor die may be prevented from damage caused by the planarization process.

Although the present inventive concepts have been described in connection with example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A method of fabricating a semiconductor device, the method comprising:
    providing a carrier substrate having a planar top surface, the carrier substrate including a conductive layer extended across the planar top surface of the carrier substrate;
    placing a semiconductor die on the carrier substrate to allow a second surface of the semiconductor die, which includes a plurality of die pads, to face the conductive layer of the carrier substrate;
    forming an insulating layer to cover the semiconductor die and the conductive layer on the carrier substrate;
    forming a via hole to penetrate the insulating layer at a side of the semiconductor die and to expose the conductive layer of the carrier substrate;
    performing a plating process in which the conductive layer of the carrier substrate is used as a seed to form a via filling the via hole;
    forming a first redistribution layer on a first surface of the semiconductor die and a first surface of the insulating layer;
    removing the carrier substrate; and
    forming a second redistribution layer on a second surface of the semiconductor die and a second surface of the insulating layer, the first surface of the semiconductor die and the second surface of the semiconductor die being located opposite each other,
    wherein a bottom surface of the via is exposed after the carrier substrate is removed.

2. The method of claim 1, further comprising:
    forming, before performing the plating process, a seed layer that covers a bottom surface and an inner lateral surface of the via hole.

3. The method of claim 2, wherein the seed layer includes a first part on the bottom surface of the via hole and a second part on the inner lateral surface of the via hole,
    wherein the first part of the seed layer is removed simultaneously when the carrier substrate is removed.

4. The method of claim 1, wherein the plating process utilizes a power that is applied to the conductive layer of the carrier substrate.

5. The method of claim 1, wherein the via hole extends into the carrier substrate.

6. The method of claim 5, wherein a bottom surface of the via protrudes beyond the second surface of the insulating layer.

7. The method of claim 1, wherein forming the second redistribution layer includes:
   forming a dielectric layer on the second surface of the semiconductor die and the second surface of the insulating layer;
   forming a pattern hole to penetrate the dielectric layer and to expose a bottom surface of the via;
   forming a seed pattern in the via hole to contact the bottom surface of the via; and
   forming a redistribution pattern on the seed pattern.

8. The method of claim 7, wherein, at an interface between the via and the seed pattern, a width of the via is greater than a width of the seed pattern.

9. The method of claim 1, wherein
   the second surface of the semiconductor die is an active surface, and
   the plurality of die pads of the semiconductor die are electrically connected to the second redistribution layer.

10. The method of claim 9, wherein
    the carrier substrate includes a dam on a top surface of the carrier substrate,
    prior to removing the carrier substrate, the carrier substrate surrounds the die pads below the semiconductor die, and
    bottom surfaces of the die pads are at a level the same as a level of the second surface of the insulating layer, and
    during forming the second redistribution layer, a dielectric layer of the second redistribution layer fills a space between the insulating layer and the die pads.

11. A method of fabricating a semiconductor device, the method comprising:
    providing a carrier substrate having a planar top surface, the carrier substrate including a conductive layer extended across the planar top surface of the carrier substrate;
    placing a semiconductor die on the carrier substrate to allow an active surface of the semiconductor die, which includes a plurality of die pads, to face the conductive layer of the carrier substrate;
    forming an insulating layer on the carrier substrate, the insulating layer surrounding the semiconductor die and covering the conductive layer;
    etching the insulating layer to form a via hole penetrating the insulating layer;
    forming a seed layer to cover a bottom surface and an inner lateral surface of the via hole;
    forming a via filling the via hole;
    forming a first redistribution layer above the semiconductor die and the insulating layer;
    removing the carrier substrate, wherein removing the carrier substrate includes removing a portion of the seed layer simultaneously when the carrier substrate is removed, the portion of the seed layer being on the bottom surface of the via hole; and
    forming a second redistribution layer below the semiconductor die and the insulating layer,
    wherein the bottom surface of the via hole is at a level lower than a level of the active surface of the semiconductor die and than a level of a bottom surface of the insulating layer.

12. The method of claim 11, wherein
    the via hole is formed to penetrate the insulating layer and to expose the conductive layer of the carrier substrate.

13. The method of claim 12, wherein
    the seed layer is in contact with the conductive layer of the carrier substrate, and
    forming the via includes performing a plating process in which the conductive layer and the seed layer are used as a seed.

14. The method of claim 11, wherein a bottom surface of the via is exposed after the carrier substrate is removed, and
    wherein the bottom surface of the via is in contact with a redistribution pattern of the second redistribution layer.

15. The method of claim 11, wherein the via protrudes beyond the bottom surface of the insulating layer.

16. The method of claim 11, wherein forming the second redistribution layer includes:
    forming a dielectric layer to cover the active surface of the semiconductor die and the bottom surface of the insulating layer;
    etching the dielectric layer to form a pattern hole that exposes the via;
    forming a seed pattern in the pattern hole to contact the via; and
    forming a redistribution pattern on the seed pattern.

* * * * *